US012595547B2

(12) United States Patent
Hunger et al.

(10) Patent No.: US 12,595,547 B2
(45) Date of Patent: Apr. 7, 2026

(54) TRANSPARENT CONDUCTIVE FILM AND USE OF SAME

(71) Applicant: GIESECKE+DEVRIENT CURRENCY TECHNOLOGY GMBH, Munich (DE)

(72) Inventors: Christoph Hunger, Hausham (DE); Kerstin Gottschling, Taufkirchen (DE); Daniel Lenssen, Munich (DE)

(73) Assignee: GIESECKE+DEVRIENT CURRENCY TECHNOLOGY GMBH, Munich (DE)

( * ) Notice: Subject to any disclaimer, the term of this patent is extended or adjusted under 35 U.S.C. 154(b) by 267 days.

(21) Appl. No.: 18/030,423

(22) PCT Filed: Sep. 21, 2021

(86) PCT No.: PCT/EP2021/025355
§ 371 (c)(1),
(2) Date: Apr. 5, 2023

(87) PCT Pub. No.: WO2022/073632
PCT Pub. Date: Apr. 14, 2022

(65) Prior Publication Data
US 2023/0374651 A1      Nov. 23, 2023

(30) Foreign Application Priority Data
Oct. 6, 2020     (DE) .......................... 102020006108.7

(51) Int. Cl.
C23C 14/20        (2006.01)
C23C 14/02        (2006.01)

(52) U.S. Cl.
CPC ............ *C23C 14/20* (2013.01); *C23C 14/024* (2013.01)

(58) Field of Classification Search
CPC .......... C08J 2367/02; C08J 7/044; C08J 7/06; C23C 14/024; C23C 14/20
See application file for complete search history.

(56) References Cited

U.S. PATENT DOCUMENTS

| | | | | |
|---|---|---|---|---|
| 4,772,523 | A | * | 9/1988 | Mace ...................... H05K 3/24 |
| | | | | 428/630 |
| 10,626,279 | B2 | | 4/2020 | Kulkarni et al. |
| 2004/0116013 | A1 | | 6/2004 | Yoshida et al. |

FOREIGN PATENT DOCUMENTS

| | | |
|---|---|---|
| CN | 105225728 A1 | 1/2016 |
| EP | 2453269 A1 | 5/2012 |
| EP | 2284134 B1 | 11/2012 |

(Continued)

OTHER PUBLICATIONS

Search Report from corresponding German Patent Application No. 10 2020 006 108.7, May 6, 2021.

(Continued)

*Primary Examiner* — Lawrence D Ferguson
(74) *Attorney, Agent, or Firm* — Workman Nydegger

(57) ABSTRACT

The invention relates to a transparent conductive film, comprising a transparent substrate, wherein a conductive metallization is formed on the main surface thereof in the form of a close-meshed, continuous network with a plurality of openings having different geometric shapes, wherein the transparent conductive film is additionally provided with a full-area transparent coating reflecting IR radiation.

12 Claims, 3 Drawing Sheets

(56) References Cited

FOREIGN PATENT DOCUMENTS

| EP | 2764996 | A1 | 8/2014 |
| EP | 2764996 | B1 | 4/2019 |
| WO | 2016192858 | A1 | 12/2016 |

OTHER PUBLICATIONS

International Search Report from corresponding PCT application No. PCT/EP2021/025355, Jan. 4, 2022.

Cho et al., "A Black Metal-dielectric Thin Film for High-contrast Displays", Journal of the Korean Physical Society, vol. 55, No. 2, Aug. 1, 2009, pp. 501-507.

Kiruthika et al., "Large Area Solution Processed Transparent Conducting Electrode Based on Highly Interconnected Cu Wire Network", Journal of Materials Chemistry C, Royal Society of Chemistry, vol. 2, Mar. 1, 2014.

* cited by examiner

TRANSPARENT CONDUCTIVE FILM AND USE OF SAME

BACKGROUND

The invention relates to a transparent conductive film and to uses thereof.

Transparent conductive films suitable, for example, for equipping the windshield of a vehicle have been described in the prior art—see, for example, EP 2764996 B1, EP 2284134 B1 and WO 2016/192858 A1. According to WO 2016/192858 A1, a transparent conductive film is produced on the basis of a multistage process in which first of all a coating which can be removed by washing is applied to a transparent carrier substrate, this coating drying to form numerous cracks in the form of a close-meshed, coherent network. This is followed by vapor deposition of metal, followed in turn by removal of the washable coating, provided with cracks, in a washing step. The nature of the product obtained is such that above the carrier substrate it has a transparent conductive metallization in the form of a close-meshed, coherent network.

In practice it has emerged that transparent conductive films having additional, advantageous properties are desirable. Particularly desirable are measures which would enable prevention of excessive heating of the interior of a motor vehicle. It has additionally been determined that the electrical conductivity of the existing transparent conductive films is insufficient. A high electrical conductivity is an advantage in particular in the case of transparent conductive electrodes for heating windows in motor vehicles and also for operating LED films with high population density. In particular, furthermore, it has been determined that in the case of copper-based metallizations in particular, the reddish perceived color of the metal on a transparent film is visually striking and therefore disruptive for the viewer. In the case of further metals, such as aluminum or silver, when viewed in reflected light or in transmitted light, a highly reflective metal surface is perceptible, particularly as glare at the glancing angle. It would therefore be desirable to provide a transparent conductive film which as compared with the existing films exhibits a neutral perceived color.

The problem of providing a transparent conductive film which exhibits at least one of the additional, advantageous properties stated above is solved by the combinations of features defined in the independent claims. Developments of the invention are subjects of the dependent claims.

SUMMARY OF THE INVENTION 1. (First aspect of the invention) A transparent conductive film comprising a transparent substrate on whose main face there is formed a conductive metallization in the form of a close-meshed, coherent network with a multiplicity of openings differing in geometric shape, wherein the transparent conductive film additionally bears a full-area, transparent, IR radiation-reflecting layer.
2. (Preferred embodiment) The transparent conductive film according to paragraph 1, wherein the full-area, IR radiation-reflecting layer is disposed between the transparent substrate and the conductive metallization in the form of a close-meshed, coherent network.
3. (Preferred embodiment) The transparent conductive film according to paragraph 1, wherein the conductive metallization in the form of a close-meshed, coherent network is disposed between the transparent substrate and the full-area, transparent, IR radiation-reflecting layer.
4. (Preferred embodiment) The transparent conductive film according to paragraph 1, wherein the full-area, transparent, IR radiation-reflecting layer is disposed on the side of the transparent substrate that is opposite the conductive metallization in the form of a close-meshed, coherent network.
5. (Preferred embodiment) The transparent conductive film according to any of paragraphs 1 to 4, wherein the full-area, transparent, IR radiation-reflecting layer is electrically conductive.
6. (Preferred embodiment) The transparent conductive film according to paragraph 5 with reference back to claim 2 or 3, wherein the conductive metallization in the form of a close-meshed, coherent network and the electrically conductive, full-area, transparent, IR radiation-reflecting layer are electrically conductively connected to one another.
7. (Preferred embodiment) The transparent conductive film according to any of paragraphs 1 to 5, wherein the conductive metallization in the form of a close-meshed, coherent network is embedded in an electrically insulating filling material.
8. (Preferred embodiment) The transparent conductive film according to any of paragraphs 1 to 7, wherein the transparent conductive film has a first transparent substrate on whose main face there is formed a conductive metallization in the form of a close-meshed, coherent network with a multiplicity of openings differing in geometric shape, and has a second transparent substrate whose main face bears a full-area, transparent, IR radiation-reflecting layer, the first substrate and the second substrate being connected to one another by means of an adhesive layer.
9. (Preferred embodiment) The transparent conductive film according to any of paragraphs 1 to 8, wherein the full-area, transparent, IR radiation-reflecting layer is a metal layer or a metal oxide layer, more particularly indium tin oxide (ITO) or aluminum-doped zinc oxide (AZO) or gallium-doped zinc oxide (GZO) or is based on a combination of a metal layer and a metal oxide layer.
10. (Preferred embodiment) The transparent conductive film according to any of paragraphs 1 to 8, wherein the full-area, transparent, IR radiation-reflecting layer additionally reduces the visual perceptibility of the conductive metallization in the form of a close-meshed, coherent network and is based on a material selected from the group consisting of a metal or an alloy, preferably chromium, aluminum, nickel, iron, silicon, titanium or a combination of two or more of the aforesaid elements, a metal oxide layer, preferably chromium oxide or a metal oxide layer based on copper oxide or on a substoichiometric aluminum oxide, an antireflective thin-layer construction with the layer sequence in particular of metal/dielectric/metal or of dielectric/metal/dielectric/metal, black chromium, black nickel, a metal sulfide layer, an overprint based on a color varnish or a pigment varnish, an antireflection layer formed by nanostructuring and/or a motheye structure, and a combination of two or more of the aforesaid elements.
11. (Preferred embodiment) The transparent conductive film according to any of paragraphs 1 to 10, wherein the transparent conductive film has two separate, full-area, transparent, IR radiation-reflecting layers disposed respectively on the top side and on the bottom side of the conductive metallization in the form of a close-meshed, coherent network.

12. (Preferred embodiment) The transparent conductive film according to any of paragraphs 1 to 11, wherein the conductive metallization in the form of a close-meshed coherent network is based on copper, gold, silver or aluminum.

13. (Second aspect of the invention) The use of the transparent conductive film according to any of paragraphs 1 to 12 for equipping the windshield or other panes of a vehicle, more particularly for heating, as electromagnetic shielding or as aerial, additionally as transparent and optionally flexible electrode for solar cells or for use in smart windows, in displays or touch panels or touch buttons, and also LED or OLED applications.

DETAILED DESCRIPTION OF THE INVENTION

The present invention is based on the technology known from WO 2016/192858 A1 for the fine-structuring of metallizations which can be used as a basis for providing electrical devices, e.g., films for use in the windshield of a vehicle. The technology includes, among other things, the use of a crack-forming coating, preferably a dispersion or a solution of a polymer. The crack-forming coating is applied to the transparent substrate, by printing, for example, to generate a thin film which in the course of drying forms cracks in the form of a close-meshed, coherent network. This is followed by vapor deposition of metal, followed in turn by removal of the washable coating, provided with cracks, in a washing step. The nature of the product obtained is such that above the transparent substrate it has a transparent conductive metallization in the form of a close-meshed, coherent network.

The present invention is based on the finding that an IR-reflecting function can be implemented in a transparent conductive film based on a metal network by providing the film additionally with a full-area, transparent, IR radiation-reflecting layer. This is accomplished more particularly by means of a metal layer which is applied thinly by vapor deposition and is therefore optically transparent, by optically transparent metal oxides such as indium tin oxide (ITO), aluminum-doped zinc oxide (AZO) or gallium-doped zinc oxide (GZO), for example, or by a combination of thin metal layer and metal oxide layer.

Additionally it has been determined that in the case of the equipping of a transparent conductive film based on a metal network with an electrically conductive, full-area, transparent, IR radiation-reflecting layer, it is possible to achieve particularly advantageous electrical conductivity of the metal network. The electrically conductive, full-area, transparent layer here ensures a full-area conductivity, while the metal network as a backbone ensures a low sheet resistance. A film of this kind is of particular advantage for a variety of applications, with regard, for example, to the provision of transparent conductive electrodes for organic photovoltaics and light-emitting diodes, and also smart windows based on electrochromic and liquid-crystalline materials.

It has been determined, moreover, that as part of the production of a metal network over a crack template in accordance with the technology known from WO 2016/192858 A1, a uniform substrate is an advantage in order to ensure consistent cracking. An electrically conductive, full-area transparent layer offers just such a uniform substrate, since the cracking when using different substrates is not necessarily always the same, and so it would be necessary to adapt the formulation of the crack template for the particular specific substrate.

An additional advantage is achievable through the fact that in the case of particular, full-area, transparent layers, it is possible to bring about a neutral perceived color with low reflection. In this way, especially in the case of copper-based metal networks, it is possible to avoid the visually disruptive, reddish perceived color of the metal.

In technical terms the production of the products of the invention is simple to perform, since the additional layers can be applied comprehensively above and/or below the metal network.

According to one preferred embodiment, the full-area, transparent, IR radiation-reflecting layer is disposed between the transparent substrate and the conductive metallization in the form of a close-meshed, coherent network.

According to a further preferred embodiment, the conductive metallization in the form of a closed-meshed, coherent network is disposed between the transparent substrate and the full-area, transparent, IR radiation-reflecting layer.

According to a further preferred embodiment, the full-area, transparent, IR radiation-reflecting layer is disposed on the side of the transparent substrate that is opposite the conductive metallization in the form of a close-meshed, coherent network.

In the event of the full-area, transparent, IR radiation-reflecting layer being electrically conductive, a transparent conductive film with particularly high electrical conductivity can be achieved if the conductive metallization in the form of a close-meshed, coherent network and the electrically conductive, full-area, transparent, IR radiation-reflecting layer are electrically conductively connected to one another.

According to one particular variant, the conductive metallization in the form of a close-meshed, coherent network is embedded in an electrically insulating filling material.

Especially suitable for achieving the advantageous effect of an IR radiation-reflecting layer is a metal layer or a metal oxide layer, more particularly indium tin oxide (ITO) or aluminum-doped zinc oxide (AZO) or gallium-doped zinc oxide (GZO), or a combination of a metal layer and a metal oxide layer. With reference to the metal layer, the metal is selected preferably from the group consisting of aluminum, chromium, silver and an alloy comprising one or more of the aforesaid elements.

Especially suitable for achieving the advantageous effect of reducing the visual perceptibility of the metallic network is a material selected from the group consisting of a metal or an alloy, preferably chromium, aluminum, nickel, iron, silicon, titanium or a combination of two or more of the aforesaid elements, a metal oxide layer, preferably chromium oxide or a metal oxide layer based on copper oxide or one based on substoichiometric aluminum oxide, an antireflective thin-layer construction having the layer sequence in particular of metal/dielectric/metal (e.g. a $Cu/SiO_2/Cr$ structure) or of dielectric/metal/dielectric/metal (e.g. an $SiO_2/Cr/SiO_2/Cu$ structure or an $SiO_2/Al/SiO_2/Cu$ structure), black chromium (i.e., black-passivated chromium), black nickel (i.e., black-passivated nickel), a metal sulfide layer, an overprint based on a color varnish or a pigmented varnish, an antireflection layer formed by nanostructuring and/or a motheye structure, and a combination of two or more of the aforesaid elements.

Antireflective thin-layer structures are known in the prior art—see, for example, Sang-Hwan Cho et al., Journal of the Korean Physical Society, vol. 55, No. 2, August 2009, 501-507.

Thin-layer elements with multilayer structure having a nanostructured region which appears dark (so-called moth-eye structure) are known for example from EP 2 453 269 A1. An antireflection layer formed by nanostructuring is based more particularly on a metal, e.g., Cu, a metal oxide, a nitride, a polymer or a dielectric.

As and when required, the structure according to the invention may additionally be provided with a transparent coating which levels out the layer structure, such as a UV-curing or thermosetting primer varnish. The product thus obtained may subsequently be provided with an adhesive layer, disposed for example on that side of the transparent substrate opposite from the layer structure. The adhesive layer may alternatively be disposed above the transparent, leveling coating. An example of a suitable adhesive layer is a heat-sealing varnish. According to one specific variant, the adhesive layer used, e.g., a heat-sealing varnish, may be identical to the transparent coating used for leveling the layer structure.

The transparent substrate is more particularly a glass substrate or a plastics film, e.g., a polyethylene terephthalate (PET) film.

For achieving an advantageous conductivity, the conductive metallization is selected preferably from a copper, gold, aluminum or silver layer.

The production of the products according to the invention is based on the production described in WO 2016/192858 A1.

The crack-forming coating used in accordance with the invention is preferably a dispersion, more preferably a colloidal dispersion. Especially suitable, for example, are dispersions of $SiO_2$ nanoparticles or of acrylic resin nanoparticles, described on page 2090 in the following document: S. Kiruthika, R. Gupta, K. D. M. Rao, S. Chakraborty, N. Padmavathy, G. U. Kulkarni: "Large area solution processed transparent conducting electrode based on highly interconnected Cu wire network", J. Mater. Chem. C, 2014, volume 2, pages 2089-2094. See also the specification U.S. Ser. No. 10/626,279 B2. Furthermore, the crack-forming coating may be based on a polymer present in solution. The polymer solution is applied to the substrate, by means of printing, for example, to produce a thin polymer film. The thin polymer film forms cracks during the drying.

The crack formation is dependent on the choice of raw materials and the choice of the substrate, the layer thickness of the crack-forming coating, and the drying parameters. In this case, at the end of the production process, achievable line thicknesses in the range from 0.5 μm to 50 μm are present, with the lines being generally so fine that they are discernible as lines only when using a magnifier. In the area, the human eye fails to resolve the individual lines, and yet both in reflected light (or in reflection) and in transmitted light (or in transmission) there is a perceptible difference relative to the untreated or plain film. Since the fine lines form an irregular, coherent network, it is possible to minimize unwanted diffraction effects. By varying the island size and the crack width it is possible to appropriately tailor the reflection capacity and/or the light transmissibility.

The process for removing the crack-bearing coating takes place advantageously by means of dissolution with a suitable solvent. The choice of the solvent is made judiciously in agreement with the coating. It is possible typically to use the following solvents: methyl acetate, ethyl acetate, propyl acetate, butyl acetate, methoxypropyl acetate, acetone, methyl ethyl ketone, methyl isobutyl ketone, cyclopentanone, cyclohexanone, methylene chloride, chloroform, toluene, xylene, methanol, ethanol, 2-propanol. Additionally it is possible to use acetals or mixtures of the aforesaid solvents. An alternative option is to detach the crack-forming coating by undermining. In this case, as well as the stated solvents, it is also possible to employ aqueous solutions, mixtures of solvents and water, optionally with surfactants, optionally with defoamers and other additives. The detachment or dissolution of the crack-bearing coating may also be assisted by spraying nozzles or else mechanically by brushing, rolling or by felts.

The metallization of the invention in the form of a close-meshed, coherent network exhibits electrical conductivity and also optical transmission comparable with that of a full-area ITO layer. In this case the fine metallic lines may be employed in combination with customary embossing varnishes, customary primer compositions and customary heat-sealing varnishes, and in that case may function as reflectors.

A further aspect of the present invention is the use of the transparent conductive film, as heating film, for example, especially in the windshield of a vehicle, in other windows or in the glazing of buildings, and also for the incoupling of power without visible input leads, for use, for example, in LED films, in solar cells, in smart glass applications, in OLEDs or in touch panels.

BRIEF DESCRIPTION OF THE DRAWINGS

Further exemplary embodiments and also advantages of the invention are elucidated below with reference to the figures, which have not been reproduced true to scale and true to proportion, so as to make them clearer.

DETAILED DESCRIPTION OF VARIOUS EMBODIMENTS

Figure 1:
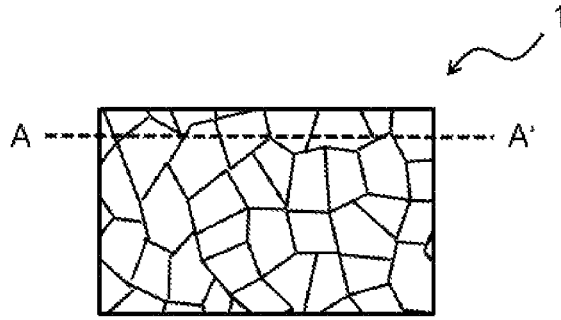
FIG. 1 shows a transparent conductive film according to a first exemplary embodiment, in plan view.

FIG. 1 illustrates a transparent conductive film 1 according to a first exemplary embodiment, in plan view. In evidence is a transparent, conductive, copper-based metallization in the form of a close-meshed, coherent network.

Figure 2:
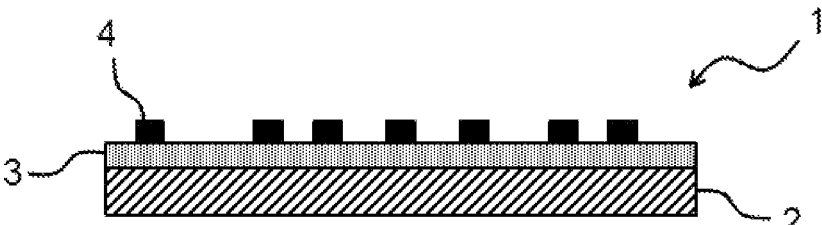
FIG. 2 shows the transparent conductive film according to the first exemplary embodiment, in cross-sectional view.

FIG. 2 shows the transparent conductive film 1 according to the first exemplary embodiment in cross-sectional view (along the dashed line A-A' represented in FIG. 1). The film 1 is based on a transparent substrate 2, in the present case a polyethylene terephthalate (PET) film, which bears a full-area, IR-reflecting layer 3 of indium tin oxide (ITO) having a thickness in a range from 50 nm to 300 nm. Located above the full-area, IR-reflecting layer is a copper-based metallization 4 in the form of a close-meshed, coherent network. The metallization 4 is generated according to the method known from WO 2016/192858 A1. Accordingly, the IR-reflecting layer 3 is first provided with a crack-forming coating, which is based, for example, on dispersions of SiO₂ nanoparticles or of acrylic resin nanoparticles. The crack-forming coating is applied preferably by printing, such as by gravure printing, flexographic printing or by means of an inkjet method. On drying, the crack-forming coating forms numerous cracks in the form of a close-meshed, coherent network. In a further step, a conductive Cu layer is applied by vapor deposition, being deposited not only above the crack-bearing coating but also within the cracks of the coating. This is followed by the removal of the crack-bearing coating, including the Cu layers present above the coating, in a washing step. The washing takes place by dissolution with a suitable solvent, e.g., methyl acetate. On the IR-reflecting indium tin oxide (ITO) layer 3 there remains a transparent conductive Cu metallization 4 in the form of a close-meshed, coherent network. By virtue of its IR-reflecting function, the transparent conductive film 1 is particularly advantageous and is suitable for example for use in the window glass in the automotive sector, to prevent the vehicle interior heating up.

Figure 3:
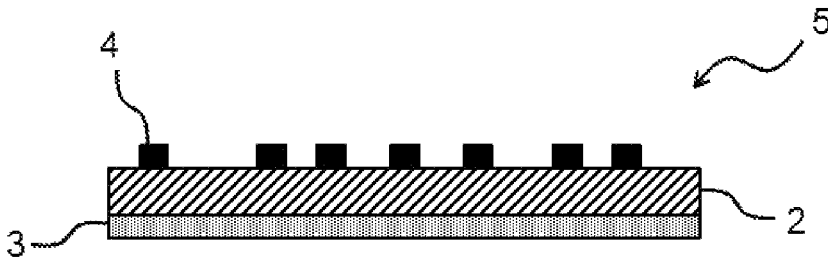
FIG. 3 shows a transparent conductive film according to a second exemplary embodiment, in cross-sectional view.

FIG. 3 shows a transparent conductive film 5 according to a second exemplary embodiment, in cross-sectional view. In the present case, the transparent substrate 2, i.e., the polyethylene terephthalate (PET) film, bears on its top side a copper-based metallization 4 in the form of a close-meshed, coherent network, with a full-area, IR-reflecting layer 3 being located on the bottom side of the transparent substrate 2. The IR-reflecting layer 3 in the present exemplary embodiment is a thin Ag layer having a thickness in the range from 1 nm to 20 nm, which as well as its IR-reflecting function additionally ensures full-area conductivity. As compared with the Ag layer 3, the metal network 4 has a low sheet resistance. The transparent conductive film 5 is advantageous if the desire is for an IR-reflecting function but no direct contact of the IR-reflecting layer with the close-meshed, coherent network.

Figure 4:
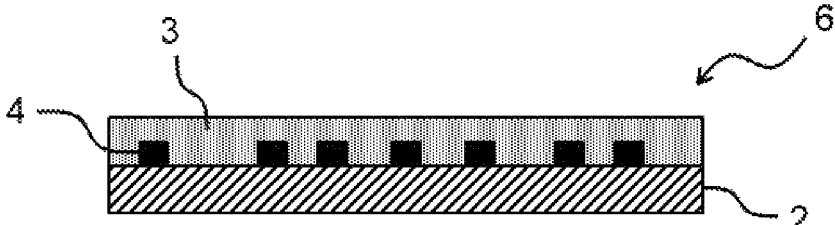
FIG. 4 shows a transparent conductive film according to a third exemplary embodiment, in cross-sectional view.

FIG. 4 shows a transparent conductive film 6 according to a third exemplary embodiment, in cross-sectional view. In the present case the transparent substrate 2, i.e., the polyethylene terephthalate (PET) film, bears on its top side firstly a copper-based metallization 4 in the form of a close-meshed, coherent network, followed by a full-area, IR-reflecting layer 3. The IR-reflecting layer 3 in the present exemplary embodiment is a thin Ag layer which as well as its IR-reflecting function additionally ensures full-area conductivity and is located, furthermore, in electrically conductive contact with the metal network 4.

Figure 5:
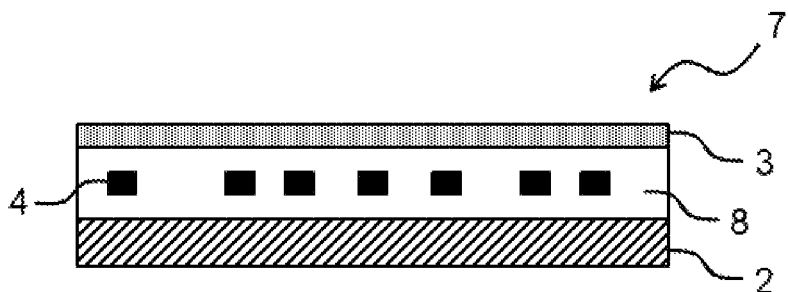
FIG. 5 shows a transparent conductive film according to a fourth exemplary embodiment, in cross-sectional view.
Figure 6:
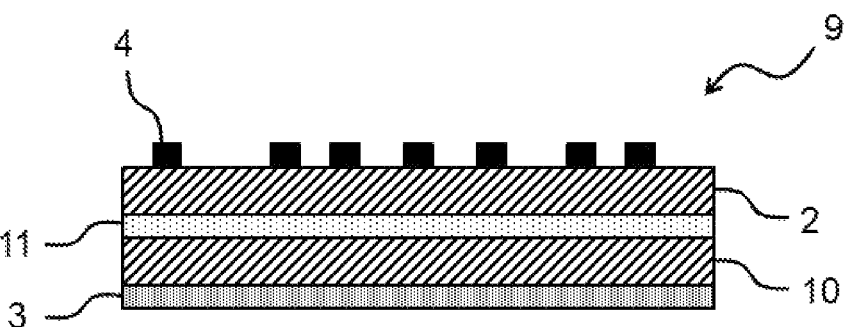
FIG. 6 shows a transparent conductive film according to a fifth exemplary embodiment, in cross-sectional view.
Figure 7:
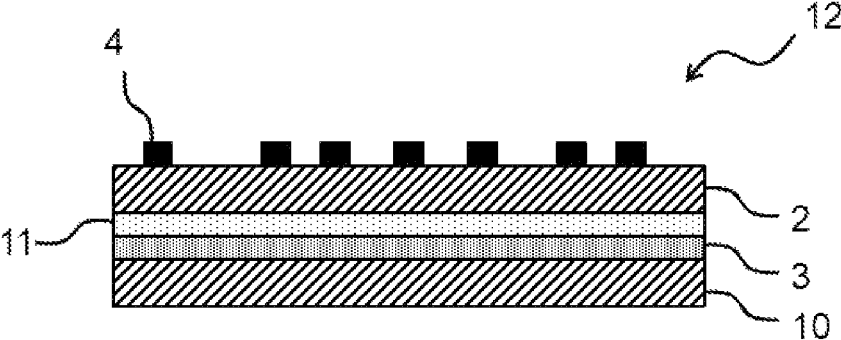
FIG. 7 shows a transparent conductive film according to a sixth exemplary embodiment, in cross-sectional view.
Figure 8:
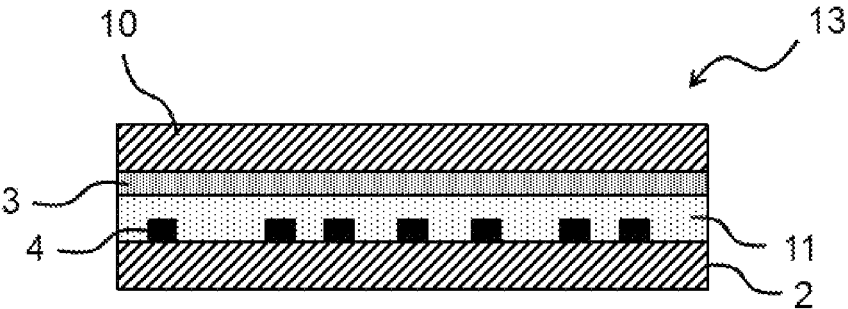
FIG. 8 shows a transparent conductive film according to a seventh exemplary embodiment, in cross-sectional view.
Figure 9:
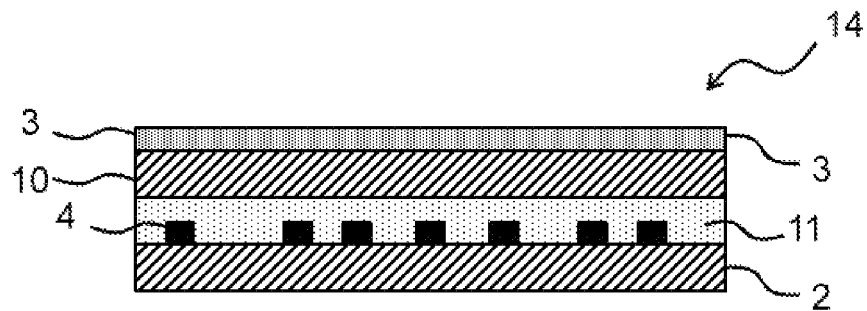
FIG. 9 shows a transparent conductive film according to a eighth exemplary embodiment, in cross-sectional view.

FIG. 5 shows a transparent conductive film 7 according to a fourth exemplary embodiment, in cross-sectional view. In the present case, the transparent substrate 2, i.e., the polyethylene terephthalate (PET) film, bears on its top side firstly a copper-based metallization 4, embedded in an electrically insulating filling material 8, in the form of a close-meshed, coherent network, followed by a full-area, IR-reflecting layer 3. The IR-reflecting layer 3 in the present exemplary embodiment is a thin Ag layer, which as well as its IR-reflecting functional additionally ensures full-area conductivity. As compared with the third exemplary embodiment shown in FIG. 4, in which the components 3 and 4 are in electrically conductive contact, the components 3 and 4 in the case of the fourth exemplary embodiment shown in FIG. 5 are electrically decoupled. In addition to its IR-reflecting function, therefore, the transparent conductive film 7 is particularly advantageous for special electronic applications.

FIGS. 6 to 9 each illustrate a fifth, sixth, seventh and, respectively, eighth exemplary embodiment, in which the transparent conductive film 9, 12, 13 or 14 has in each case a first transparent substrate 2 whose main face features a conductive metallization 4 in the form of a close-meshed, coherent network having a multiplicity of openings differing in geometric shape, and has a second transparent substrate 10 whose main face bears a full-area, transparent, IR radiation-reflecting layer 3, with the first substrate 2 and the second substrate 10 being joined to one another by means of an adhesive layer 11. The generation of the transparent conductive film 9, 12, 13, 14 starting from two separate film elements by means of adhesive bonding simplifies the production operation and provides the producer with freedom of design.

With regard to the selection of material for constituents 2, 3 and 4, the transparent conductive film 9, 12, 13, 14 in the respective fifth, sixth, seventh and eighth exemplary embodiments is based on the first, second, third and fourth exemplary embodiments described earlier on above.

The invention claimed is:

1. A transparent conductive film comprising a transparent substrate on whose main face there is formed a conductive metallization in the form of a close-meshed, coherent network with a multiplicity of openings differing in geometric shape,
    wherein the transparent conductive film additionally bears a full-area, transparent, IR radiation-reflecting layer;
    wherein the full-area, transparent, IR radiation-reflecting layer is a metal layer or a metal oxide layer, or is based on a combination of a metal layer and a metal oxide layer.

2. The transparent conductive film according to claim 1, wherein the full-area, IR radiation-reflecting layer is disposed between the transparent substrate and the conductive metallization in the form of a close-meshed, coherent network.

3. The transparent conductive film according to claim 1, wherein the conductive metallization in the form of a close-meshed, coherent network is disposed between the transparent substrate and the full-area, transparent, IR radiation-reflecting layer.

4. The transparent conductive film according to claim 1, wherein the full-area, IR radiation-reflecting layer is disposed on the side of the transparent substrate that is opposite the conductive metallization in the form of a close-meshed, coherent network.

5. The transparent conductive film according to claim 1, wherein the full-area, transparent, IR radiation-reflecting layer is electrically conductive.

6. The transparent conductive film according to claim 2, wherein the full-area, transparent, IR radiation-reflecting layer is electrically conductive;
    wherein the conductive metallization in the form of a close-meshed, coherent network and the electrically conductive, full-area, transparent, IR radiation-reflecting layer are electrically conductively connected to one another.

7. The transparent conductive film according to claim 1, wherein the conductive metallization in the form of a close-meshed, coherent network is embedded in an electrically insulating filling material.

8. The transparent conductive film according to claim 1, wherein the transparent conductive film has a first transparent substrate on whose main face there is formed a conductive metallization in the form of a close-meshed, coherent network with a multiplicity of openings differing in geometric shape, and has a second transparent substrate whose main face bears a full-area, transparent, IR radiation-reflecting layer, the first substrate and the second substrate being connected to one another by means of an adhesive layer.

9. The transparent conductive film according to claim 1, wherein the full-area, transparent, IR radiation-reflecting layer is a metal oxide layer selected from the group consisting of indium tin oxide (ITO), aluminum-doped zinc oxide (AZO), gallium-doped zinc oxide (GZO).

10. The transparent conductive film according to claim 1, wherein the full-area, transparent, IR radiation-reflecting layer additionally reduces the visual perceptibility of the conductive metallization in the form of a close-meshed, coherent network and is based on a material selected from the group consisting of a metal or an alloy, including chromium, aluminum, nickel, iron, silicon, titanium or a combination of two or more of the aforesaid elements, a metal oxide layer, including chromium oxide or a metal oxide layer based on copper oxide or on a substoichiometric aluminum oxide, an antireflective thin-layer construction with the layer sequence in particular of metal/dielectric/ metal or of dielectric/metal/dielectric/metal, black chromium, black nickel, a metal sulfide layer, an overprint based on a color varnish or a pigment varnish, an antireflection layer formed by nanostructuring and/or a motheye structure, and a combination of two or more of the aforesaid elements.

11. The transparent conductive film according to claim 1, wherein the transparent conductive film has two separate, full-area, transparent, IR radiation-reflecting layers disposed respectively on the top side and on the bottom side of the conductive metallization in the form of a close-meshed, coherent network.

12. The transparent conductive film according to claim 1, wherein the conductive metallization in the form of a close-meshed coherent network is based on copper, gold, silver or aluminum.

\* \* \* \* \*